(12) United States Patent
Chen et al.

(10) Patent No.: US 7,153,768 B2
(45) Date of Patent: Dec. 26, 2006

(54) BACKSIDE COATING FOR MEMS WAFER

(75) Inventors: Fei-Yuh Chen, Hinchu (TW); Eugene Chu, Cyonglin Township, Hsinchu County (TW); Yuh-Hwa Chang, Shulin (TW); David Ho, Taichung (TW)

(73) Assignee: Taiwan Semiconductor Manufacturing Co. (TW)

( * ) Notice: Subject to any disclaimer, the term of this patent is extended or adjusted under 35 U.S.C. 154(b) by 121 days.

(21) Appl. No.: 11/056,142

(22) Filed: Feb. 10, 2005

(65) Prior Publication Data
US 2006/0177992 A1   Aug. 10, 2006

(51) Int. Cl.
*H01L 21/4763* (2006.01)
*H01L 21/44* (2006.01)
*H01L 21/46* (2006.01)

(52) U.S. Cl. .................. 438/648; 438/107; 438/458

(58) Field of Classification Search ............... 438/458, 438/107, 648
See application file for complete search history.

(56) References Cited

U.S. PATENT DOCUMENTS

| 6,653,200 B1 | 11/2003 | Olsen |
| 7,057,794 B1 * | 6/2006 | Wang et al. ............... 359/290 |
| 2003/0054588 A1 * | 3/2003 | Patel et al. ............... 438/107 |

* cited by examiner

*Primary Examiner*—Michael Lebentritt
*Assistant Examiner*—Elias Ullah
(74) *Attorney, Agent, or Firm*—Duane Morris LLP; Steven E. Koffs

(57) ABSTRACT

A transparent substrate has a micro electro-mechanical system (MEMS) on a first side of the substrate. An opaque layer is formed on a second side of the transparent substrate opposite the first side. The opaque layer comprises a first material that is removable by a MEMS release process. A second layer is formed on the opaque layer. The second layer comprises a second material that prevents contamination of a front end of line machine by the first material during a front end of line fabrication process.

13 Claims, 3 Drawing Sheets

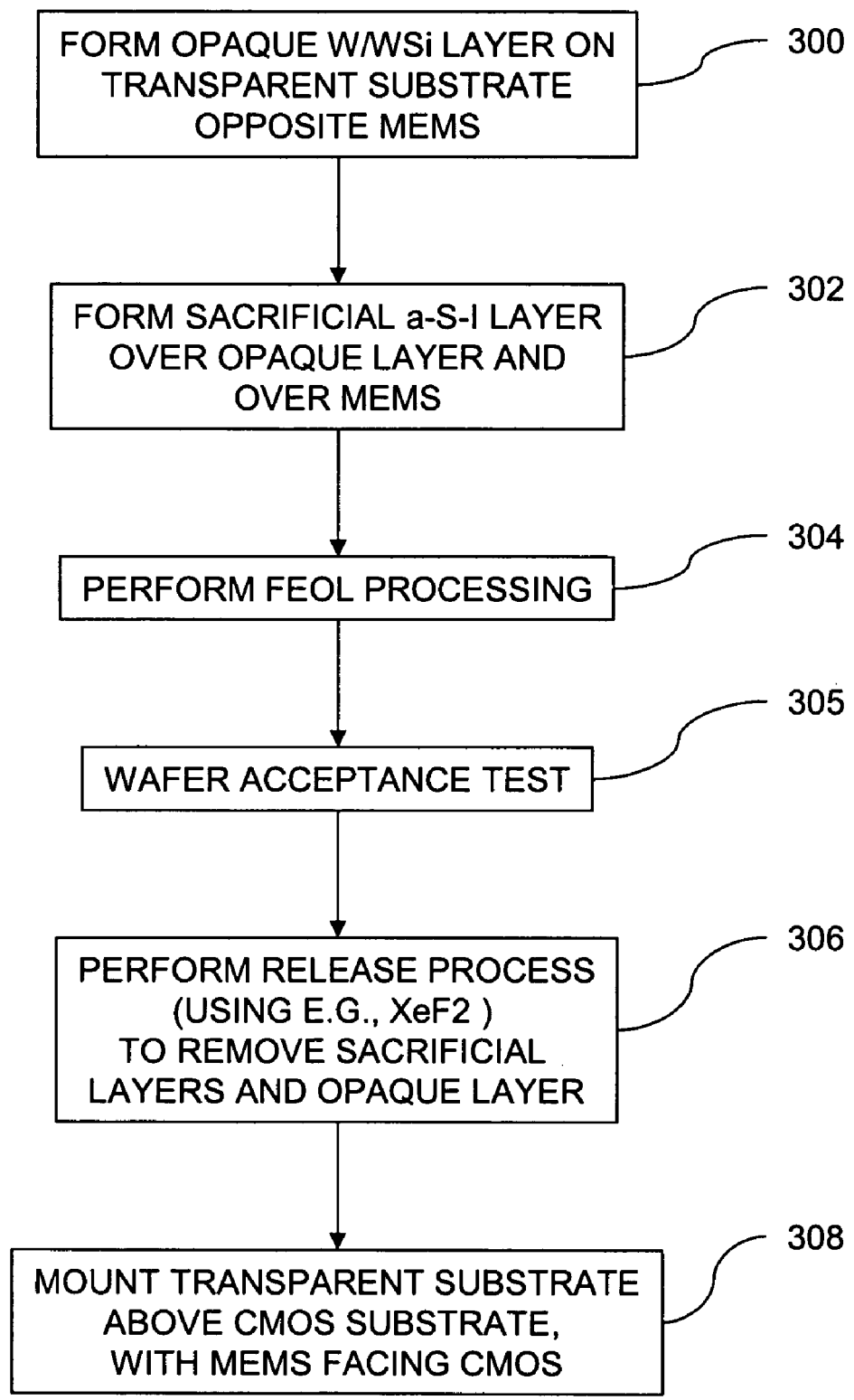

BACKSIDE COATING FOR MEMS WAFER

FIELD OF THE INVENTION

The present invention relates to semiconductor fabrication generally, and more specifically to processing substrates including microelectro-mechanical system (MEMS).

BACKGROUND

In recent years, the projection-display industry has undergone a period of explosive growth. Until a few years age, such projection display systems were predominantly based on either cathode-ray tube (CRT) or active-matrix liquid crystal display (LCD) technology. However, all of these traditional display systems suffer from limitations that compromise their performance or the spectrum of their applicability. LCD-based and CRT-based systems are limited in their ability to support high-brightness applications, and they suffer from uniformity and stability problem in large-scale applications.

In 1996, Texas Instrument (TI) introduced to the market a novel microelectro-mechanical system (MEMS) based, high performance projection technology that addresses these issues. This technology, called Digital light Processing (DLP), is based on the Digital Micromirror Device (DMD), a light switch that uses electrostatically controlled MEMS mirror structures to modulate light digitally, producing stable, high-quality imagery on screen. FIG. 1A shows a conventional substrate 100 having a plurality of MEMS mirrors 102 thereon.

MEMS devices such as mirrors, electric motors, springs cantilevered devices, and mechanical switches and oscillators can be formed on the same substrate along with electronic circuits. These tiny mechanical devices have movable elements. A movable element such as a mirror is patterned of material deposited onto a sacrificial layer. The sacrificial layer is then removed by selective isotropic etching in a release process which undercuts the mirror, freeing it from the substrate. Cantilevered devices such as mirrors, mechanical switches, tuning forks or other oscillators, and leaf springs, are similarly formed partially over a sacrificial layer, with an anchored portion connected to a subjacent structure.

The DLP system is a fast reflective digital light switch, which combines image processing, memory, a light source, and optics. It is monolithically fabricated by a complementary metal oxide semiconductor (CMOS) process over a normal CMOS integrated circuit (IC).

The RSM (Reflectivity Stealth Mirror) is a new development product of the DLP systems. It operates using accepted digital video techniques and transmits to the eye a burst of digital light pluses that the eye interprets as a color image. Each light switch has an aluminum mirror that can reflect light in one direction depending on the state of the underlying memory cell. FIG. 1D shows an RSM system, including the transparent substrate 100 with MEMS mirrors 102. The transparent substrate 100 is mounted above the CMOS substrate 110, with CMOS circuitry 112 thereon, and spacers between the substrates 100 and 110.

RSM fabrication processes have been developed by Taiwan Semiconductor Manufacturing Company since 2001. The process can be separated into two parts, including MEMS (Aluminum mirror) processing and operational CMOS IC processing. The MEMS process uses a glass wafer for optical applications.

The DLP light switch is manufactured by a CMOS-like process, using a transparent substrate 100, such as a glass wafer, to transmit light. However, use of a transparent substrate creates a transfer problem in the IC manufacturing process. Almost all currently available machines need to orient the wafer to control transfer of the wafer, and need to sense the wafer using an infrared detector. So it is common to apply a Ti/OX backside coating 104 on the back side 100a of the transparent substrate 100 (opposite the side on which the MEMS 102 are formed), as shown in FIG. 1B, to solve this problem.

However, the MEMS fabrication process still has several serious issues. First, although the Ti/OX coating 104 on the backside can solve the transfer problem, an additional process is required to remove the Ti/OX. This includes photo coating, backside etching, dry photoresist striping, and wet post clean. This places a large load on the backside etching capacity of the equipment, increasing cycle time and wastes capacity. In some cases, with Ti/OX removal included in the front end of line (FEOL) processing, preventive maintenance must be performed after processing 24 pieces due to etch rate decay and contamination. This is a burden for production.

Further, the back side of the wafer may be damaged (as shown by damaged surface 100b in FIGS. 1C and 1D) during the etching process. In some configurations, the wafer 100 is bigger then the pedestal (not shown) on which the wafer is mounted during etching. Thus, an outer annular region of the backside of the wafer 100 is exposed to etching gas during etching. In this situation, damage to the wafer backside 100b is hard to avoid.

Damage to the backside 100b of the wafer 100 causes transfer errors in the procedures that follow the Ti/OX removal, and may result in the need to scrap the wafer in the manufacturing line (e.g., if light transmission efficiency is affected).

The other disadvantage of the above mentioned process is that the backside Ti/OX coating 104 needs to be removed during the FEOL fabrication process, so that the wafer again becomes transparent. However, to perform wafer acceptance test (WAT), the infrared sensor of the equipment needs to detect the wafer flat side before it can transfer the wafer to the WAT station. Because the infrared sensor cannot perform the detection after the removal of the Ti/OX layer, the (now transparent) wafer 100 cannot be transferred. Thus, WAT is not available for transparent substrates.

An improved process for transparent substrates with a MEMS thereon is desired.

SUMMARY OF THE INVENTION

A transparent substrate having a micro electro-mechanical system (MEMS) on a first side thereof is processed. An opaque layer is formed on a second side of the transparent substrate opposite the first side. The opaque layer comprises a first material that is removable by a MEMS release process. A second layer is formed on the opaque layer. The second layer comprises a second material that prevents contamination of a front end of line machine by the first material during a front end of line fabrication process.

BRIEF DESCRIPTION OF THE DRAWINGS

FIG. 3 is a flow chart diagram of a method for processing a transparent substrate.

DETAILED DESCRIPTION

Figure 1A:
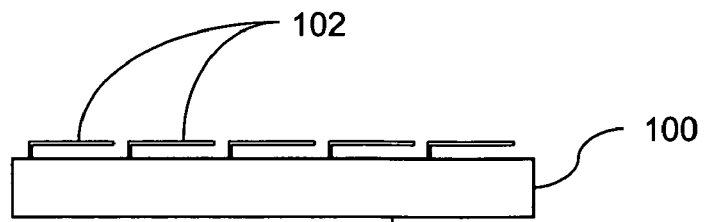
FIG. 1A shows a conventional transparent substrate having MEMS mirrors formed theron.
Figure 1B:
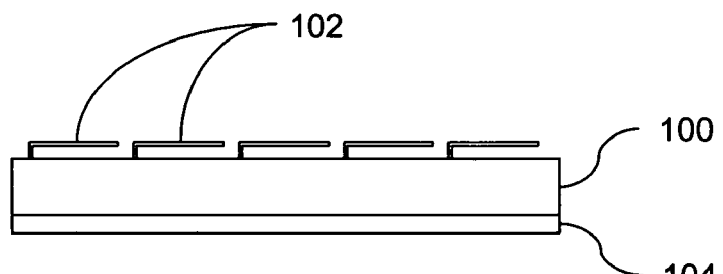
FIG. 1B shows the substrate of FIG. 1A, with a Ti/OX coating on the back side thereof.
Figure 1C:
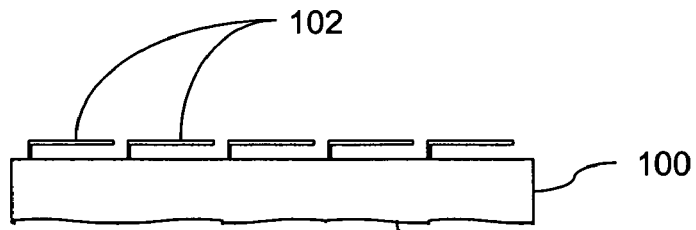
FIG. 1C. shows the substrate of FIG. 1B, after removal of the Ti/OX coating.
Figure 1D:
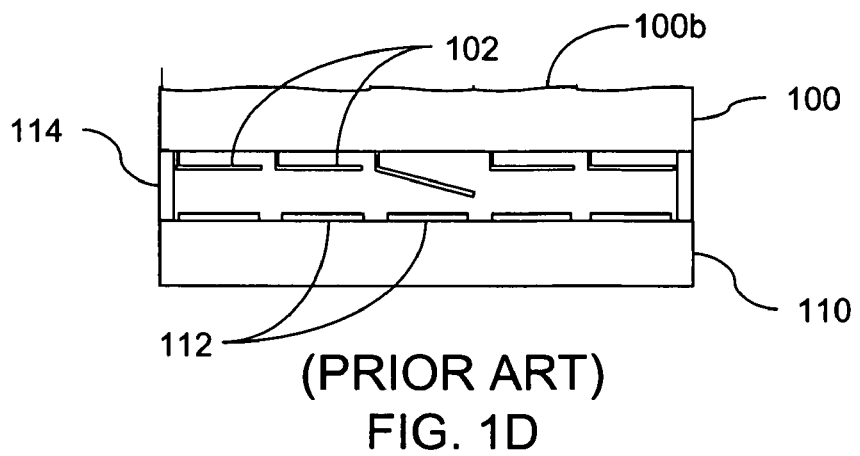
FIG. 1D shows a reflectivity stealth mirror including the substrate of FIG. 1C.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

FIGS. 2A to 2D and 3 show an exemplary method for processing a transparent substrate 200 having at least one micro electro-mechanical system (MEMS) 206 on a first side thereof. In the example, the process is used to form a reflectivity stealth mirror.

Figure 2A:
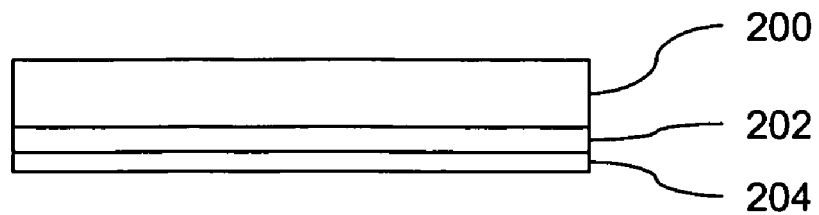
FIG. 2A shows a transparent substrate having coatings thereon according to one embodiment.

Step 300 of FIG. 3 and FIG. 2A show a step of forming an opaque layer 202 on a second side of the transparent substrate 200 opposite the first side. The opaque layer 202 comprises a first material that is removable by a MEMS release process. In some embodiments, the first material is one of the group consisting of W and WSi, but other opaque materials may be used, so long as the material of the opaque layer 202 can be removed by a MEMS release process that is to be used to release the movable MEMS element 206. In some embodiments, the thickness of the opaque layer 202 is between about 500 Å and about 6000 Å.

At step 302, a second layer 204 is formed on the opaque layer 202, as shown in FIG. 2A. The second layer 204 comprises a second material that prevents contamination of a front end of line (FEOL) machine (not shown) by the first material 202 during an FEOL process. The second material 204 can be a sacrificial material, and may be the same material that is also applied as a sacrificial layer 208 (FIG. 2B) on the first side of the substrate 200. In some embodiments, the thickness of the second layer 204 is between about 500 Å and about 2000 Å. The layers 202 and 204 may be deposited during glass wafer manufacturing, for example before glass cutting.

In some embodiments, the sacrificial material used in layers 204 and 208 is amorphous silicon (a-Si). In other embodiments, the material of layers 204 and 208 may be different from a-Si, such as silicon nitride, silicon oxynitride or other suitable material. In some embodiments, layers 204 and 208 may be made of different materials from each other. The selection of the material(s) for layers 202, 204 and 208 and the selection of the parameters (e.g., type of plasma, duration) of the release process are coordinated, so that the release process can remove the layers 202, 204 and 208.

Figure 2B:
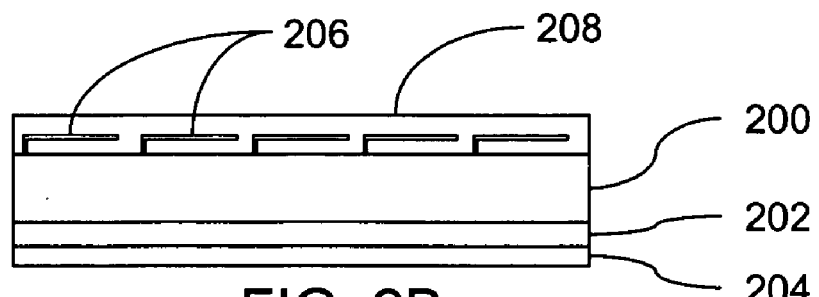
FIG. 2B shows the substrate of FIG. 2A, with MEMS and a sacrificial layer formed on the side of the substrate opposite the coatings.

At step 304, the FEOL processing is performed on the substrate 200 while maintaining the opaque layer 202 and the second layer 204 on the second side of the substrate. This processing may include any number and combination of steps, including chemical vapor deposition (CVD), and/or etching and/or oxidation, and/or doping, and/or polishing and the like. Preferably, the MEMS structures 206 are formed during the FEOL processing, with a movable element formed on and/or within the sacrificial layer 208, as shown in FIG. 2B.

By keeping the opaque layer 202 and the second layer 204 on the back side of the substrate 200, the substrate back side is protected during the FEOL processing, and contamination of the processing equipment by the first material of the opaque layer 202 is avoided. By eliminating the contamination due to Ti/OX removal during FEOL processing, the number of pieces that can be produced between preventive maintenance operations is increased. Further, because there is no removal of the opaque layer during the FEOL processing, the extra Ti/OX removal steps (Photoresist coating, backside etching, and dry and wet photoresist stripping) of the prior art process can be eliminated from FEOL processing, and the adverse impacts of the Ti/OX removal on cycle time and capacity usage are eliminated. This also reduces the cost of processing the transparent substrate 200, reducing the total cost of the RSM system.

At step 305, a wafer acceptance test can be performed while the opaque layer 202 remains on the second side of the substrate 200. The apparatus can readily detect the flat side of the opaque layer 202 using the existing IR detector of the equipment. Thus, the transfer problem of trying to automatically register the transparent wafer after removal of the Ti/OX layer is overcome.

Figure 2C:
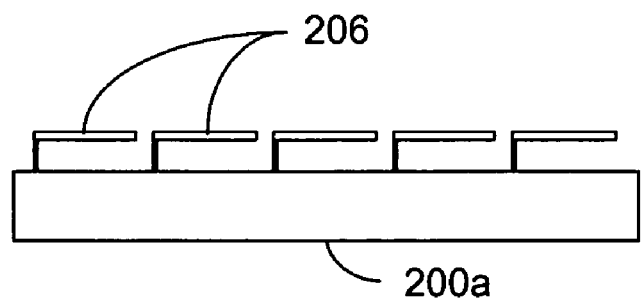
FIG. 2C shows the substrate of FIG. 2B, with the coatings and sacrificial layer removed.

At step 306 (as shown in FIG. 2C), a release process is performed to remove the sacrificial material 208 from the first side of the substrate 200 to release the movable element of the MEMS 206. The release process also removes the sacrificial material 204 from the second side of the substrate, and removes the opaque material 202 from the second side. Preferably, this is achieved in a single release step. The wafer is supported during the release process to allow both the front and back sides of the wafer to be etched at the same time to perform the release and remove the a-Si and W/WSi from the back side. One can use XeF$_2$ to produce a chemical reaction to release the a-Si/W/WSix (Removable film). Both sides of the wafer (front and backside) can thus be exposed in the reaction chamber at the same time.

In some embodiments, the release process includes exposing the substrate to isotropic flow of XeF$_2$ plasma. Other etching gases or plasma may be used for the release process. In other embodiments, the release process may include a wet etch step.

Figure 2D:
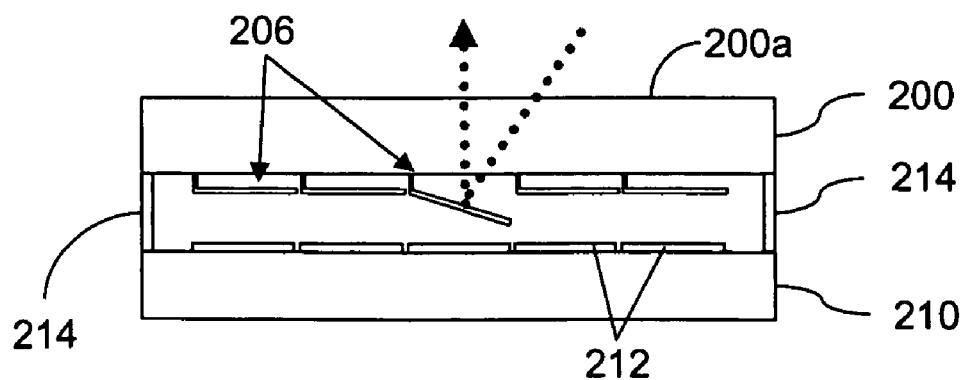
FIG. 2D shows a reflectivity stealth mirror including the substrate of FIG. 2C.

At step 308 (as shown in FIG. 2D), the transparent substrate 200 is mounted above a CMOS substrate 210, with spacers 214 therebetween, and with the MEMS 206 facing the CMOS substrate, to form a reflectivity stealth mirror.

According to another aspect, in some embodiments, as shown in FIG. 2B, a structure comprises: a transparent substrate 200 having a micro electro-mechanical system (MEMS) 206 on a first side thereof, an opaque layer 202 on a second side of the transparent substrate 206 opposite the first side, and a second layer 204 on the opaque layer 202. The opaque layer 202 comprises a first material that is removable by a MEMS release process. The second layer 204 comprises a second material that prevents contamination of an FEOL machine by the first material during a front end of line fabrication process.

In some embodiments, the first material is one of the group consisting of W and WSi. In some embodiments, a layer 208 of a sacrificial material is applied on the first side of the substrate 200. In some embodiments, the second material 204 is the same sacrificial material as layer 208 applied on the first side of the substrate. In some embodiments, the sacrificial material is amorphous silicon.

Although an example is described above in which the MEMS is a mirror for a reflectivity stealth mirror, the invention is not limited to this example. Other types of MEMS may also be fabricated on transparent substrates using the techniques described above. For example, the MEMS may be a rotor of an electric motor, cantilevered devices such as mechanical switches, tuning forks or other oscillators, and leaf springs, or other MEMS. Further, although the exemplary MEMS substrate 200 is mounted above a CMOS substrate 210, in other embodiments, the MEMS substrate is not mounted above a CMOS substrate.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for processing a transparent substrate having a micro electro-mechanical system (MEMS) on a first side thereof, comprising the steps of:
   forming an opaque layer on a second side of the transparent substrate opposite the first side, the opaque layer comprising a first material that is removable by a MEMS release process; and
   forming a second layer on the opaque layer, the second layer comprising a second material that prevents contamination of a front end of line machine by the first material during a front end of line fabrication process.

2. The method of claim 1, wherein the first material is one of the group consisting of W and WSi.

3. The method of claim 1, wherein the second material is a sacrificial material that is applied on the first side of the substrate.

4. The method of claim 3, wherein the sacrificial material is amorphous silicon.

5. The method of claim 3, further comprising:
   performing a release process that removes the sacrificial material from the first and second sides of the substrate and removes the opaque material from the second side of the substrate.

6. The method of claim 5, wherein the release process includes exposing the substrate to $XeF_2$ plasma.

7. The method of claim 5, wherein the sacrificial material is removed from the first and second sides of the substrate and the opaque material is removed from the second side of the substrate during a single release process step.

8. The method of claim 5, wherein the MEMS is a reflectivity stealth mirror, and the method further comprises:
   mounting the transparent substrate above a complementary metal oxide semiconductor (CMOS) substrate, with the MEMS facing the CMOS substrate.

9. The method of claim 1, further comprising:
   performing a front end of line process on the substrate while maintaining the opaque layer and the second layer on the second side of the substrate.

10. The method of claim 9, further comprising:
    performing a wafer acceptance test while the opaque layer remains on the second side of the substrate.

11. The method of claim 10, further comprising:
    removing a sacrificial material from the first side of the substrate and the opaque material and the second layer from the second side of the substrate during a single release process step after the wafer acceptance test.

12. The method of claim 1, wherein:
    the second material is a sacrificial material that is applied on the first side of the substrate,
    the MEMS is a reflectivity stealth mirror, and
    the method further comprises:
    performing a front end of line process on the substrate while maintaining the opaque layer and the second layer on the second side of the substrate;
    performing a single release process step that removes the sacrificial material from the first and second sides of the substrate and removes the opaque material from the second side of the substrate.
    mounting the transparent substrate above a complementary metal oxide semiconductor (CMOS) substrate, with the MEMS facing the CMOS substrate.

13. The method of claim 12, wherein:
    the first material is one of the group consisting of W and WSi,
    the sacrificial material comprises amorphous silicon, and
    the release process includes exposing the substrate to XeF2 gas.

* * * * *